United States Patent
Fukunaga

(10) Patent No.: US 6,452,954 B2
(45) Date of Patent: Sep. 17, 2002

(54) HIGH-POWER SEMICONDUCTOR LASER DEVICE HAVING CURRENT CONFINEMENT STRUCTURE AND INDEX-GUIDED STRUCTURE AND OSCILLATING IN TRANSVERSE MODE

(75) Inventor: Toshiaki Fukunaga, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 54 days.

(21) Appl. No.: 09/777,822

(22) Filed: Feb. 7, 2001

(30) Foreign Application Priority Data

Feb. 8, 2000 (JP) ........................ 2000-030349

(51) Int. Cl.$^7$ ................................. H01S 5/00
(52) U.S. Cl. ........................... 372/46; 372/45
(58) Field of Search .................. 372/46, 45, 50

(56) References Cited

U.S. PATENT DOCUMENTS 5,042,043 A * 8/1991 Hatano et al. ............ 372/45

FOREIGN PATENT DOCUMENTS

| JP | 60116188 A | * 6/1985 | ............ H01S/3/18 |
| JP | 08097502 A | * 4/1996 | ............ H01S/3/18 |
| JP | 08340148 A | * 12/1996 | ............ H01S/3/18 |
| JP | 9-307190 | 11/1997 | ............ H01S/3/18 |
| JP | 10233530 A | * 9/1998 | ............ H01S/3/18 |
| JP | 11-204882 | 7/1999 | ............ H01S/3/18 |
| JP | 2000101142 A | * 4/2000 | ............ H01S/3/18 |

OTHER PUBLICATIONS

Nakamura, Shuji et al, "InGaN/GaN/AlGaN–Based Laser Diodes Grown on GaN Substrates with a Fundamental Transverse Mode", Jpn J. Appl. Phys. vol. 37 part 2, No. 9A/B (1998) pp. L1020–L1022 Sep. 1998.
Patent Abstract of Japan 09–307190 Nov. 28, 1997.
Patent Abstract of Japan 11–204882 Jul. 30, 1999.

* cited by examiner

*Primary Examiner*—Quyen Leung
(74) *Attorney, Agent, or Firm*—Sughrue Mion, PLLC

(57) ABSTRACT

In a semiconductor laser device: an active layer; a first upper cladding layer of a first conductive type; a current confinement layer of a second conductive type; a second upper cladding layer of the first conductive type; and a contact layer of the first conductive type are formed above a GaN layer of the second conductive type. In the semiconductor laser device: a groove is formed through the full thickness of the current confinement layer so as to form an index-guided structure; the active layer is a single or multiple quantum well active layer formed by alternately forming at least one $In_{x1}Ga_{1-x1}N$ well and a plurality of $In_{x2}Ga_{1-x2}N$ barriers, where $0 \leq x2 < x1 < 0.5$; the current confinement layer has a superlattice structure formed with $Ga_{1-z4}Al_{z4}N$ barriers and GaN wells, where $0 < z4 < 1$; the second upper cladding layer is formed over the current confinement layer so as to cover the groove; and the contact layer is formed on the entire upper surface of the second upper cladding layer.

5 Claims, 1 Drawing Sheet

HIGH-POWER SEMICONDUCTOR LASER DEVICE HAVING CURRENT CONFINEMENT STRUCTURE AND INDEX-GUIDED STRUCTURE AND OSCILLATING IN TRANSVERSE MODE

BACKGROUND OF THE INVENTION

1. Field of the Invention

The present invention relates to a semiconductor laser device having an index-guided structure.

2. Description of the Related Art

S. Nakamura et al. ("InGaN/GaN/AlGaN-Based Laser Diodes Grown on GaN Substrates with a Fundamental Transverse Mode," Japanese Journal of Applied Physics, vol. 37 (1998) L1020–L1022) disclose a short-wavelength semiconductor laser device which emits laser light in the 410 nm band.

This semiconductor laser device is formed as follows. First, a GaN substrate is formed by forming a first GaN layer on a sapphire substrate, selectively growing a second GaN layer by using a $SiO_2$ mask, and removing an excessive portion of the second GaN layer above the top surface of the $SiO_2$ mask. Then, an n-type GaN buffer layer, an n-type InGaN crack preventing layer, an n-type AlGaN/n-type GaN modulation-doped superlattice cladding layer, an n-type GaN optical waveguide layer, an n-type InGaN/InGaN multiple quantum well active layer, a p-type AlGaN carrier block layer, a p-type GaN optical waveguide layer, a p-type AlGaN/GaN modulation-doped superlattice cladding layer, and a p-type GaN contact layer are formed on the above GaN substrate. In addition, an index-guided structure is realized by forming a ridge structure having a width of about 2 micrometers. However, since it is very difficult to control the etching depth, the maximum output power in the fundamental transverse mode is at most about 30 mW. In the above semiconductor laser device, the contact area between the p electrode and the p-type GaN contact layer is small, and therefore the contact resistance and heat generation are great. Therefore, it is difficult to increase the output power.

In addition, as disclosed in Japanese Unexamined Patent Publication, No. 9 (1997)-307190, in the conventional GaN-based index-guided semiconductor laser devices, the index-guided structure is realized by the difference in the refractive index between an AlGaN current confinement layer and a cladding layer. However, when a difference between equivalent refractive indexes is increased to a large value in order to obtain a high quality laser beam by current confinement using the AlGaN current confinement layer, the relative composition of aluminum in the AlGaN current confinement layer becomes greater than that in the cladding layer. Therefore, it is difficult to form the AlGaN current confinement layer with a sufficient thickness.

In order to solve the above problem, Japanese Unexamined Patent Publication, No. 11(1999)-204882 discloses a semiconductor laser device having a ridge-type index-guided structure realized by an AlGaN current confinement layer, and the current confinement layer is realized by a thick superlattice structure. In this semiconductor laser device, an attempt to decrease the contact resistance between the electrode and the contact layer is made in order to avoid the aforementioned problem of the heat generation due to the contact resistance. However, since the index-guided structure is realized by forming the ridge, the contact area is small, and therefore the contact resistance cannot be sufficiently decreased. In addition, since the stripe area should be formed corresponding to an undefective region of the GaN layer, and the undefective region has a width of about 2 micrometers, the maximum possible width of the stripe area is about 2 micrometers. Therefore, it is difficult to realize a wide-stripe high-power semiconductor laser device.

SUMMARY OF THE INVENTION

The object of the present invention is to provide a semiconductor laser device which can oscillate in a fundamental transverse mode even when output power is high, and output a high-quality Gaussian laser beam.

According to the present invention, there is provided a semiconductor laser device comprising a GaN layer of a first conductive type; an active layer; a first upper cladding layer of a second conductive type; a current confinement layer of the first conductive type; a second upper cladding layer of the second conductive type; and a GaN contact layer of the second conductive type. In the semiconductor laser device, the active layer, the first upper cladding layer, the current confinement layer, the second upper cladding layer, and the GaN contact layer are formed above the GaN layer; a groove is formed through the full thickness of the current confinement layer so as to form an index-guided structure; the active layer is a single or multiple quantum well active layer formed by alternately forming at least one $In_{x1}Ga_{1-x1}N$ well and a plurality of $In_{x2}Ga_{1-x2}N$ barriers, where $0 \leq x2 < x1 < 0.5$; the current confinement layer has a superlattice structure formed with $Ga_{1-z4}Al_{z4}N$ barriers and GaN wells, where $0 < z4 < 1$; the second upper cladding layer is formed over the current confinement layer so as to cover the groove; and the GaN contact layer is formed on the entire upper surface of the second upper cladding layer. In the active layer, the $In_{x2}Ga_{1-x2}N$ barriers are arranged in both of the outermost layers of the single or multiple quantum well active layer.

Due to the above construction, the semiconductor laser device according to the present invention can oscillate in a fundamental transverse mode, and output a high-quality Gaussian laser beam even when output power is high.

In particular, since the active layer is a single or multiple quantum well active layer formed by alternately forming at least one $In_{x1}Ga_{1-x1}N$ well and a plurality of $In_{x2}Ga_{1-x2}N$ barriers, the probability of occurrence of a crystal defect can be reduced, and the semiconductor laser device according to the present invention can generate a reliable short-wavelength laser beam. Further, when the active layer is a multiple quantum well active layer, the characteristics of the semiconductor laser device can be improved. For example, the threshold current can be reduced.

When an aluminum-rich GaAlN material is used in a layered structure made of GaN-based materials, the lattice mismatch occurs, and it is difficult to obtain a highly reliable, high-quality semiconductor laser device. However, since, according to the present invention, the current confinement layer has a superlattice structure formed with $Ga_{1-z4}Al_{z4}N$ barriers and GaN wells, and $0 < z4 < 1$, it is possible to form the current confinement layer with a thickness equal to or greater than a critical thickness, i.e., the thickness of the current confinement layer can be sufficiently increased so that a desired difference in the equivalent refractive index can be achieved.

Further, since the second upper cladding layer is formed over the current confinement layer so as to cover the groove, and the contact layer is formed on the entire upper surface of the second upper cladding layer, the contact area between the second upper cladding layer and the contact layer can be increased, and the contact resistance can be reduced.

Therefore, the emission efficiency can be increased, and the threshold current can be reduced. In particular, when the output power is high, it is possible to reduce heat generation in and near the electrode. Thus, it is possible to prevent deterioration of the semiconductor layers and the electrode due to the heat generation.

Since the index-guided structure is realized by the internal confinement structure, the width of the groove can be adjusted by etching with high accuracy, and therefore a desired stripe width can be realized. Thus, the semiconductor laser device according to the present invention can generate a high-quality laser beam.

Preferably, the semiconductor laser device according to the present invention may also have one or any possible combination of the following additional features (i) to (iv).

(i) The $Ga_{1-z4}Al_{z4}N$ barriers in the current confinement layer may be doped with a dopant of the first conductive type.

(ii) The $Ga_{1-z4}Al_{z4}N$ barriers and the GaN wells in the current confinement layer may be doped with a dopant of the first conductive type.

In either of the cases (i) and (ii), a desired difference between the equivalent refractive index of the portion of the active layer under the groove and the equivalent refractive index of the other portion of the active layer under the current confinement layer other than the groove can be obtained, and therefore a high-quality laser beam can be obtained.

(iii) The groove may have a width equal to or greater than 1 micrometer, and smaller than 3 micrometers, and the difference between the equivalent refractive index of the portion of the active layer under the groove for light in a propagation mode in the thickness direction and the equivalent refractive index of the other portion of the active layer under the current confinement layer (other than the groove) for the light in the propagation mode in the thickness direction may be in a range of 0.001 to 0.007.

In this case, the semiconductor laser device according to the present invention can oscillate in the fundamental transverse mode which is controlled with high accuracy.

(iv) The groove may have a width equal to or greater than 3 micrometers, and the difference between the equivalent refractive index of the portion of the active layer under the groove for light in a propagation mode in the thickness direction and the equivalent refractive index of the other portion of the active layer under the current confinement layer (other than the groove) for the light in the propagation mode in the thickness direction may be in a range of 0.001 to 0.02.

In this case, it is possible to avoid the instability of the transverse modes due to the higher-mode oscillation.

The first conductive type is different in carrier polarity from the second conductive type. That is, when the first conductive type is n type, the second conductive type is p type.

DESCRIPTION OF PREFERRED EMBODIMENT

Figure 1:
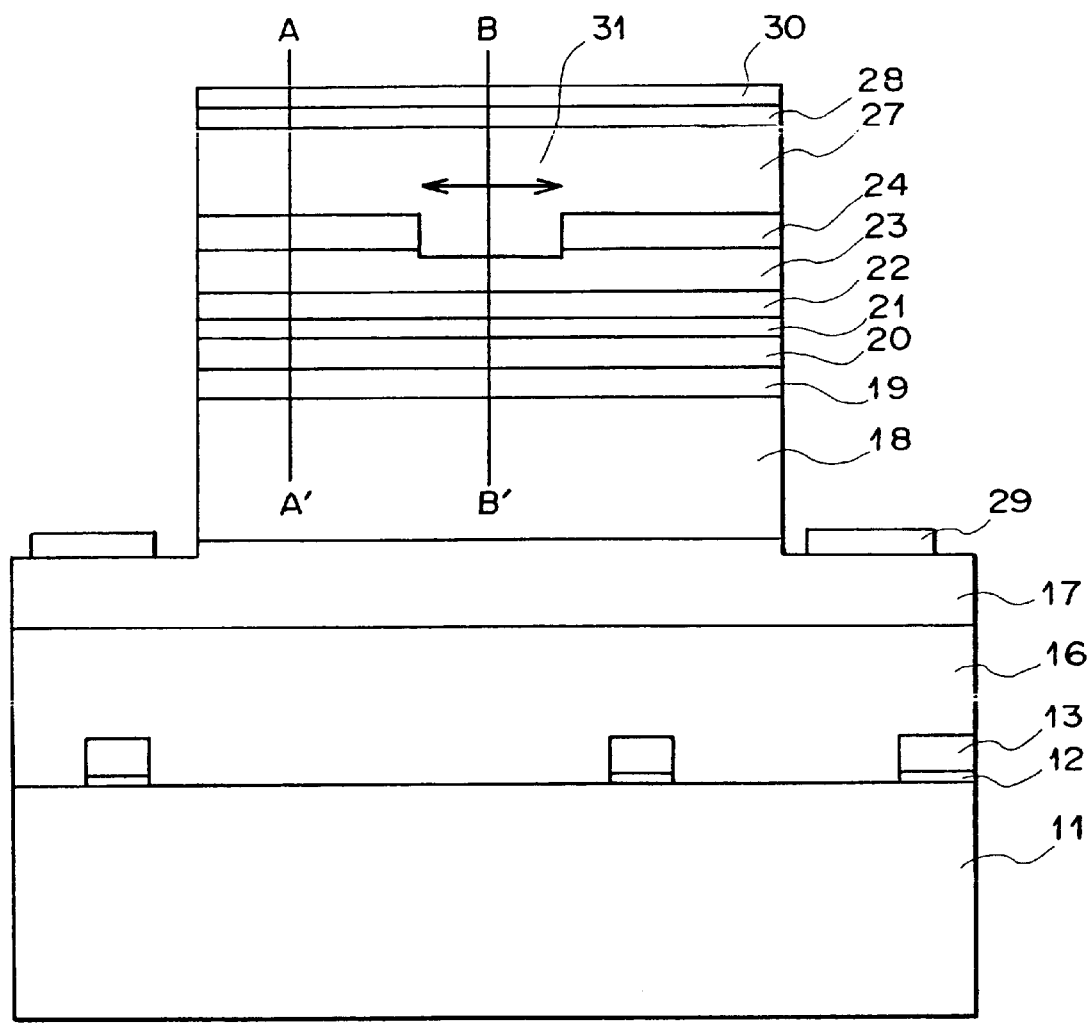
FIG. 1 is a cross-sectional view of the semiconductor laser device as the first embodiment of the present invention.

An embodiment of the present invention and its variations are explained in detail below with reference to the drawing.

FIG. 1 is a cross-sectional view of the semiconductor laser device as an embodiment of the present invention.

As illustrated in FIG. 1, a GaN buffer layer 12 having a thickness of about 20 nm is formed on a (0001) C face of a sapphire substrate 11 at a temperature of 500° C. by organometallic vapor phase epitaxy. Then, a GaN layer 13 having a thickness of about 2 micrometers is formed on the GaN buffer layer 12 at a temperature of 1,050° C. Next, a $SiO_2$ layer 14 (not shown) is formed on the GaN layer 13, and a resist 15 is applied to the $SiO_2$ layer 14 (not shown). Then, stripe areas of the $SiO_2$ layer 14 are removed by using conventional lithography, where the stripe areas are oriented in the <1100> direction and spaced with intervals of about 10 micrometers, and each have a width of about 7 micrometers. Thereafter, the exposed stripe areas of the GaN buffer layer 12 and the GaN layer 13 are removed to the depth of the upper surface of the sapphire substrate 11 by dry etching using a chlorine gas as an etchant and the remaining portions of the $SiO_2$ layer 14 and the resist 15 as a mask. At this time, the sapphire substrate 11 may also be etched. Then, the $SiO_2$ layer 14 and the resist 15 are removed, so that stripe grooves are formed between the remaining portions of the GaN buffer layer 12 and the GaN layer 13. Next, a GaN layer 16 having a thickness of about 20 micrometers is formed by selective growth. Due to growth in the lateral directions, the above stripe grooves between the remaining portions of the GaN buffer layer 12 and the GaN layer 13 are filled with the GaN layer 16, the remaining portions of the GaN buffer layer 12 and the GaN layer 13 are covered with the GaN layer 16, and finally the surface of the GaN layer 16 is planarized.

Subsequently, an n-type GaN contact layer 17, an n-type $Ga_{1-z1}Al_{z1}N/GaN$ superlattice lower cladding layer 18, an n-type or i-type (intrinsic) $Ga_{1-z2}Al_{z2}N$ optical waveguide layer 19, a Si-doped $In_{x2}Ga_{1-x2}N/In_{x1}Ga_{1-x1}N$ multiple quantum well active layer 20 ($0.5>x1>x2\geq0$), an p-type $Ga_{1-z3}Al_{z3}N$ carrier block layer 21, an n-type or i-type $Ga_{1-z2}Al_{z2}N$ optical waveguide layer 22, a p-type $Ga_{1-z1}Al_{z1}N/GaN$ superlattice first upper cladding layer 23, and an n-type $Ga_{1-z4}Al_{z4}N/GaN$ superlattice current confinement layer 24 are formed. Thereafter, a $SiO_2$ layer 25 (not shown) is formed, and a resist 26 is applied to the $SiO_2$ layer 25 (not shown). Then, stripe areas of the $SiO_2$ layer 25 are removed by using conventional lithography, where the stripe areas each have a width of 2 micrometers (as indicated by the reference number 31). Then, the exposed stripe areas of the n-type $Ga_{1-z4}Al_{z4}N/GaN$ superlattice current confinement layer 24 are etched to a mid-thickness of the p-type $Ga_{1-z1}Al_{z1}N/GaN$ superlattice first upper cladding layer 23 by using a chlorine gas as an etchant and the remaining portions of the $SiO_2$ layer 25 and the resist 26 as a mask so as to form a groove. After the remaining portions of the $SiO_2$ layer 25 and the resist 26 are removed, a p-type $Ga_{1-z1}Al_{z1}N/GaN$ superlattice second upper cladding layer 27 and a p-type GaN contact layer 28 are formed. In the formation of the above layers, trimethyl gallium (TMG), trimethyl indium (TMI), trimethyl aluminum (TMA), and ammonia are used as raw materials, silane gas is used as an n-type dopant gas, and cycropentadienyl magnesium (Cp2Mg) is used as a p-type dopant gas.

In the above construction, the compositions and the thicknesses of the p-type $Ga_{1-z1}Al_{z1}N/GaN$ superlattice first upper cladding layer 23 and the n-type $Ga_{1-z4}Al_{z4}N/GaN$ superlattice current confinement layer 24 are arranged such that the fundamental transverse mode is achieved.

It is preferable that the above groove formed in the n-type $Ga_{1-z4}Al_{z4}N/GaN$ superlattice current confinement layer 24 is located above a region of the GaN layer 16 which is not likely to contain a defect. The first regions of the GaN layer 16 above the remaining areas of the GaN layer 13 are likely to contain a defect through the thickness of the GaN layer 16, and the second regions of the GaN layer 16 located approximately midway between the remaining areas of the GaN layer 13 are likely to contain a defect since the second regions are finally filled by the selective growth in the lateral directions. Therefore, it is preferable that the above groove formed in the n-type $Ga_{1-z4}Al_{z4}N$/GaN superlattice current confinement layer 24 is not located right above the first and second regions of the GaN layer 16, as illustrated in FIG. 1.

Next, in order to enable contact with n electrodes 29, both sides of the above index-guided structure are etched to a mid-thickness of the n-type GaN contact layer 17 by photolithography and dry etching. Then, the lower surface of the sapphire substrate 11 is polished, and the n electrodes 29 and p electrode 30 are formed by conventional lithography and evaporation. Thereafter, end surfaces of the resonant cavity are formed by cleaving the layered materials, and a high-reflection coating (not shown) and a low-reflection coating (not shown) are laid on the end surfaces of the resonant cavity, respectively. Then, the construction of FIG. 1 is formed into a chip.

In the above construction, the compositions of the AlGaN layers are arranged such that $1>z4>z1>z2 \geq 0$ and $0.4>z3>z2$. In this case, when the equivalent refractive index of the region including the cross section A–A' illustrated in FIG. 1 is denoted by $n_A$, and the equivalent refractive index of the region including the cross section B–B' illustrated in FIG. 1 is denoted by $n_B$, it is possible to control the difference $n_B-n_A$ in the equivalent refractive index so that $7 \times 10^{-3} > n_B - n_A > 1 \times 10^{-3}$.

Although only the $Ga_{1-z4}Al_{z4}N$ barriers in the $Ga_{1-z4}Al_{z4}N$/GaN superlattice current confinement layer 24 are doped with the n type dopant in the above embodiment, the GaN wells in the $Ga_{1-z4}Al_{z4}N$/GaN superlattice current confinement layer 24 may also be doped with an n type dopant.

Each layer in the construction of the above embodiment may be formed by molecular beam epitaxy using a solid or gas raw material.

The conductivity type of the GaN contact layer 17 may be inverted. In this case, the conductivity types of all of the other layers in the above construction should be inverted accordingly.

The oscillation wavelength of the semiconductor laser device as the above embodiment can be controlled within the range between 380 and 550 nm.

Although the sapphire substrate 11 is used in the above embodiment, the substrate may be made of one of SiC, ZnO, $LiGaO_2$, $LiAlO_2$, GaAs, GaP, Ge, and Si.

In the semiconductor laser device as the above embodiment, the sapphire substrate 11 and the GaN layer 16 remain as constituents of the semiconductor laser device, and portions of the upper surfaces of the n-type GaN contact layer 17 are exposed in order to enable contact with the n electrodes 29. However, alternatively, the sapphire substrate 11 and the GaN layer 16 may be removed so as to expose the lower surface of the n-type GaN contact layer 17, and then the other layers above the n-type GaN contact layer 17 may be formed, where the n-type GaN contact layer 17 is used as a substrate. In this case, an n electrode can be formed on the lower surface of the n-type GaN contact layer 17.

Although the semiconductor laser device as the above embodiment is arranged so as to oscillate in the fundamental transverse mode, the stripe groove formed in the current confinement layer may have a width of 3 micrometers or more. In this case, the semiconductor laser device according to the present invention can be used with a wavelength conversion element or a fiber laser, where the semiconductor laser device according to the present invention functions as a low-noise wide-stripe semiconductor laser device which excites the wavelength conversion element or the fiber laser.

When the present invention is applied to a wide-stripe semiconductor laser device, it is preferable to use the GaN substrates disclosed in Japanese patent applications, Nos. 2000-4940, 11(1999)-285146, 11(1999)-289069, and 11(1999)-292112, which are assigned to the assignee of the present patent application. In each of the GaN substrates disclosed in the above Japanese patent applications, the probability of occurrence of a defect through the thickness of the substrate is low, and the probability of occurrence of a defect is low in a wide area of the substrate. Therefore, the reliability of the semiconductor laser device can be further increased by use of the above substrates.

The semiconductor laser device according to the present invention can be used as a light source in the fields of high-speed, information processing, image processing, communications, laser measurement, medicine, printing, and the like.

What is claimed is:

1. A semiconductor laser device comprising:

a GaN layer of a first conductive type;

an active layer;

a first upper cladding layer of a second conductive type;

a current confinement layer of said first conductive type;

a second upper cladding layer of said second conductive type; and a GaN contact layer of said second conductive type;

wherein said active layer, said first upper cladding layer, said current confinement layer, said second upper cladding layer, and said contact layer are formed above said GaN layer;

a groove is formed through a full thickness of said current confinement layer so as to form an indexguided structure;

said active layer is a single or multiple quantum well active layer formed by alternately forming at least one $In_{x1}Ga_{1-x1}N$ well and a plurality of $In_{x2}G_{1-x2}N$ barriers, where $0 \leq x2 < x1 < 0.5$;

said current confinement layer has a superlattice structure formed with $Ga_{1-z4}Al_{z4}N$ barriers and GaN wells, where $0 < z4 < 1$;

said second upper cladding layer is formed over said current confinement layer so as to cover said groove; and said GaN contact layer is formed on an entire upper surface of said second upper cladding layer.

2. A semiconductor laser device according to claim 1, wherein said $Ga_{1-z4}Al_{z4}N$ barriers in said current confinement layer are doped with a dopant of said first conductive type.

3. A semiconductor laser device according to claim 1, wherein said $Ga_{1-z4}Al_{z4}N$ barriers and said GaN wells in said current confinement layer are doped with a dopant of said first conductive type.

4. A semiconductor laser device according to claim 1, wherein said groove has a width equal to or greater than 1 micrometer, and smaller than 3 micrometers, and a difference between an equivalent refractive index of a portion of said active layer under said groove for light in a propagation mode in a thickness direction and an equivalent refractive index of another portion of said active layer under said current confinement layer other than said groove for said light is in a range of 0.001 to 0.007.

5. A semiconductor laser device according to claim 1, wherein said groove has a width equal to or greater than 3 micrometers, and a difference between an equivalent refractive index of a portion of said active layer under said groove for light in a propagation mode in a thickness direction and an equivalent refractive index of another portion of said active layer under said current confinement layer other than said groove for said light is in a range of 0.001 to 0.02.

* * * * *